United States Patent
Chen et al.

(10) Patent No.: US 7,335,544 B2
(45) Date of Patent: Feb. 26, 2008

(54) METHOD OF MAKING MOSFET DEVICE WITH LOCALIZED STRESSOR

(75) Inventors: Chien-Hao Chen, Chuangwei Township (TW); Donald Y. Chao, Shin-Chu (TW); Tze-Liang Lee, Hsinchu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 72 days.

(21) Appl. No.: 11/012,413

(22) Filed: Dec. 15, 2004

(65) Prior Publication Data
US 2006/0125028 A1  Jun. 15, 2006

(51) Int. Cl.
*H01L 29/739* (2006.01)

(52) U.S. Cl. .................. 438/197; 438/199; 438/585; 438/595

(58) Field of Classification Search ............ 257/410, 257/411, 346, 349, 300, 412; 438/197, 199, 438/585, 595
See application file for complete search history.

(56) References Cited

U.S. PATENT DOCUMENTS

| | | | |
|---|---|---|---|
| 4,514,895 A | | 5/1985 | Nishimura |
| 6,258,714 B1* | | 7/2001 | Shrivastava ................ 438/638 |
| 6,563,152 B2 | | 5/2003 | Roberds et al. |
| 6,573,172 B1* | | 6/2003 | En et al. .................... 438/626 |
| 7,045,408 B2* | | 5/2006 | Hoffmann et al. .......... 438/199 |
| 2003/0181005 A1* | | 9/2003 | Hachimine et al. ......... 438/231 |
| 2004/0251479 A1* | | 12/2004 | Tsutsui et al. .............. 257/249 |

OTHER PUBLICATIONS

Ito, S., et al., "Mechanical Stress Effect of Etch-Stop Nitride and Its Impact on Deep Submicron Transistor Design," IEDM (2000) pp. 247-250.

Ootsuka, F., et al., "A Highly Dense, High-Performance 130nm Node CMOS Technology for Large Scale System-On-A-Chip Applications," IEDM (2000) pp. 575-578.

Scott, G., et al., "NMOS Drive Current Reduction Caused by Transistor Layout and Trench Isolation Induced Stress," IEDM (1999) pp. 827-830.

Shimizu, A., et al., "Local Mechanical-Stress Control (LMC): A New Technique for CMOS-Performance Enhancement," IEDM (2001) pp. 433-436.

* cited by examiner

*Primary Examiner*—Evan Pert
(74) *Attorney, Agent, or Firm*—Slater & Matsil, L.L.P.

(57) ABSTRACT

A metal-oxide-semiconductor field-effect transistors (MOSFET) having localized stressors is provided. In accordance with embodiments of the present invention, a transistor comprises a high-stress film over the source/drain regions, but not over the gate electrode. The high-stress film may be a tensile-stress film for use with n-channel devices or a compressive-stress film for use with p-channel devices. A method of fabricating a MOSFET with localized stressors over the source/drain regions comprises forming a transistor having a gate electrode and source/drain regions, forming a high-stress film over the gate electrode and the source/drain regions, and thereafter removing the high-stress film located over the gate electrode, thereby leaving the high-stress film located over the source/drain regions. A contact-etch stop layer may be formed over the transistor.

24 Claims, 3 Drawing Sheets

METHOD OF MAKING MOSFET DEVICE WITH LOCALIZED STRESSOR

TECHNICAL FIELD

The present invention relates generally to semiconductor devices, and more particularly, to metal-oxide-semiconductor field-effect transistors and methods of manufacture.

BACKGROUND

Size reduction of metal-oxide-semiconductor field-effect transistors (MOSFET), including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOSFET) or for p-channel (PMOSFET) devices. Generally, it is desirable to induce a tensile strain in the n-channel of an NMOSFET transistor in the source-to-drain direction to increase electron mobility and to induce a compressive strain in the p-channel of a PMOSFET transistor in the source-to-drain direction to increase hole mobility. There are several existing approaches of introducing strain in the transistor channel region.

In one approach, semiconductor alloy layers, such as silicon-germanium or silicon-germanium-carbon, are formed below an overlying thin semiconductor layer, wherein the semiconductor alloy layer has a different lattice structure than the overlying semiconductor layer. The difference in the lattice structure imparts strain in the overlying semiconductor layer to increase carrier mobility.

This approach, however, can be difficult to process in addition to presenting junction leakage concerns as a result of the blanket semiconductor alloy layer. The epitaxial growth of the semiconductor alloy layer, such as a silicon-germanium layer, can be costly and difficult to accurately control the level of germanium in the epitaxially grown semiconductor alloy layer. In addition, the presence of a blanket semiconductor alloy layer allows an unwanted interface between the source/drain regions to exist, possibly introducing junction leakage.

In another approach, strain in the channel is introduced after the transistor is formed. In this approach, a high-stress film is formed over a completed transistor structure formed in a silicon substrate. The high-stress film or stressor exerts significant influence on the channel, modifying the silicon lattice spacing in the channel region, and thus introducing strain in the channel region. In this case, the stressor is placed above the completed transistor structure. The device performance is obtained by increasing the stress or thickness of the high-stress film.

The strain contributed by the high-stress film is believed to be uniaxial in nature with a direction parallel to the source-to-drain direction. However, uniaxial tensile strain degrades the hole mobility while uniaxial compressive strain degrades the electron mobility. Ion implantation of germanium can be used to selectively relax the strain so that the hole or electron mobility is not degraded, but this is difficult to implement due to the close proximity of the n-channel and p-channel transistors.

Furthermore, the thickness of the high-stress film is limited by subsequent gap-fill capabilities and the etching window. The high-stress film also covers the polysilicon gate electrode, spacers, and the active area, which is not optimal to imparting local mechanical stress in the channel region because the stress from the polysilicon gate electrode and the spacers degrade the stress in the channel region.

Therefore, there is a need for an efficient and cost-effective method to induce strain such that the performance characteristics of transistors are enhanced.

SUMMARY OF THE INVENTION

These and other problems are generally reduced, solved or circumvented, and technical advantages are generally achieved, by embodiments of the present invention, which provides a strained semiconductor device to improve the operating characteristics of the semiconductor device and a method of manufacture.

In an embodiment of the present invention, a metal-oxide-semiconductor field-effect transistor (MOSFET) having localized stressors is provided. The MOSFET comprises a high-stress film over the source/drain regions, but not over the gate electrode. The high-stress film may be a tensile-stress film for use with n-channel devices or a compressive-stress film for use with p-channel devices.

In another embodiment of the present invention, a method of fabricating a MOSFET with localized stressors over the source/drain regions is provided. The method comprises forming a transistor having a gate electrode and source/drain regions, forming a high-stress film over the gate electrode and the source/drain regions, and thereafter removing the high-stress film located over the gate electrode, thereby leaving the high-stress film located over the source/drain regions.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
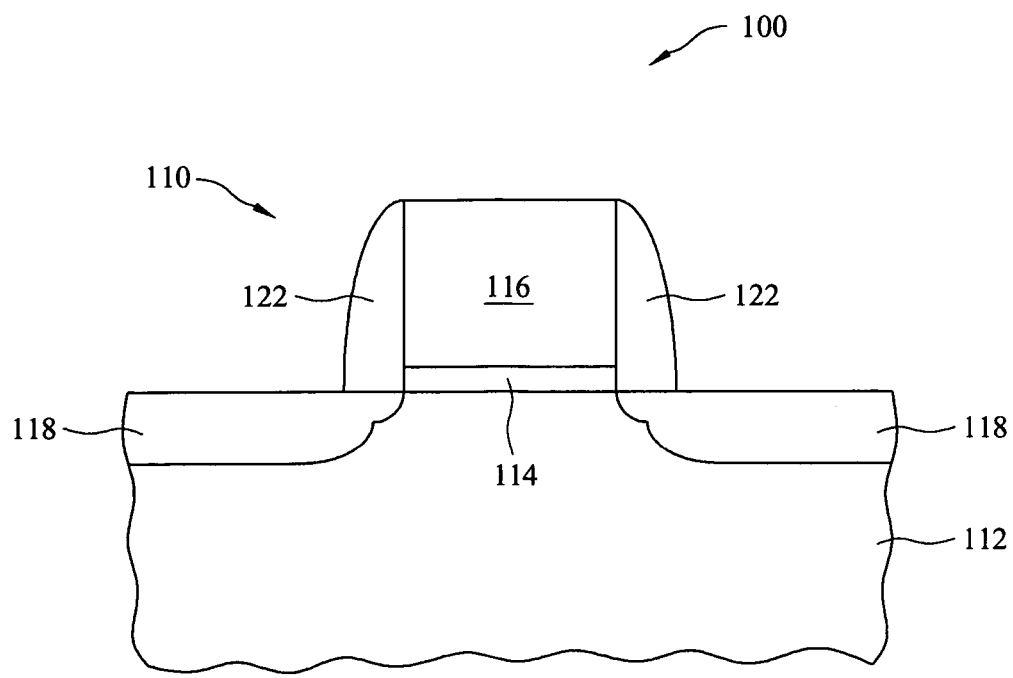
FIGS. 1-3 illustrate various process steps of fabricating a MOSFET device having localized stressors positioned over the source/drain regions.
Figure 2:
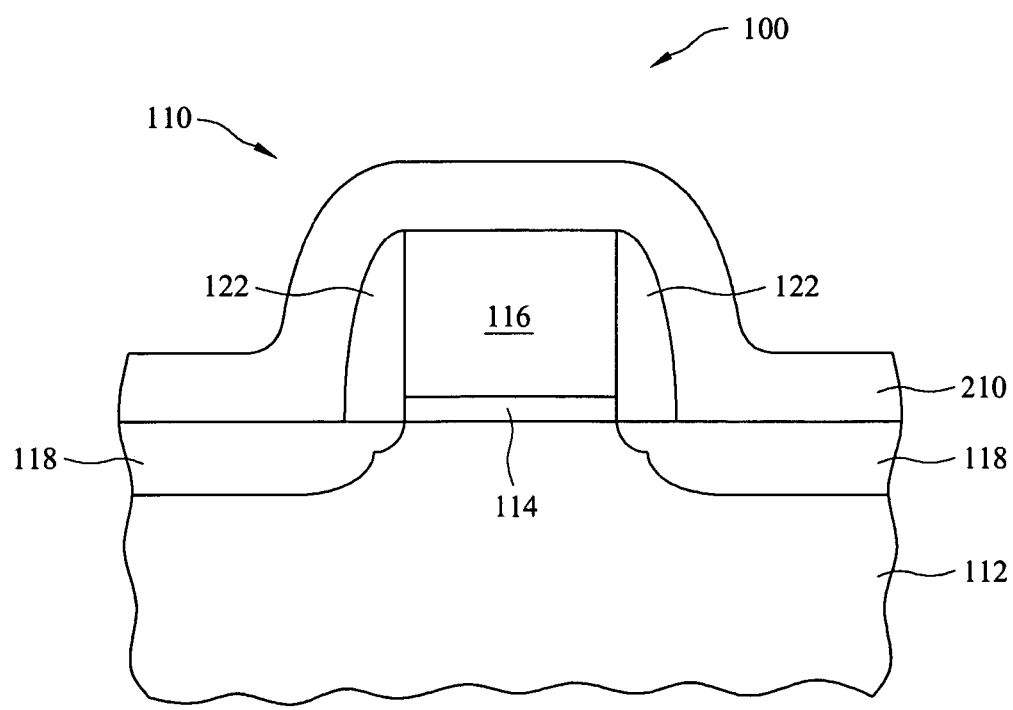
Figure 3:
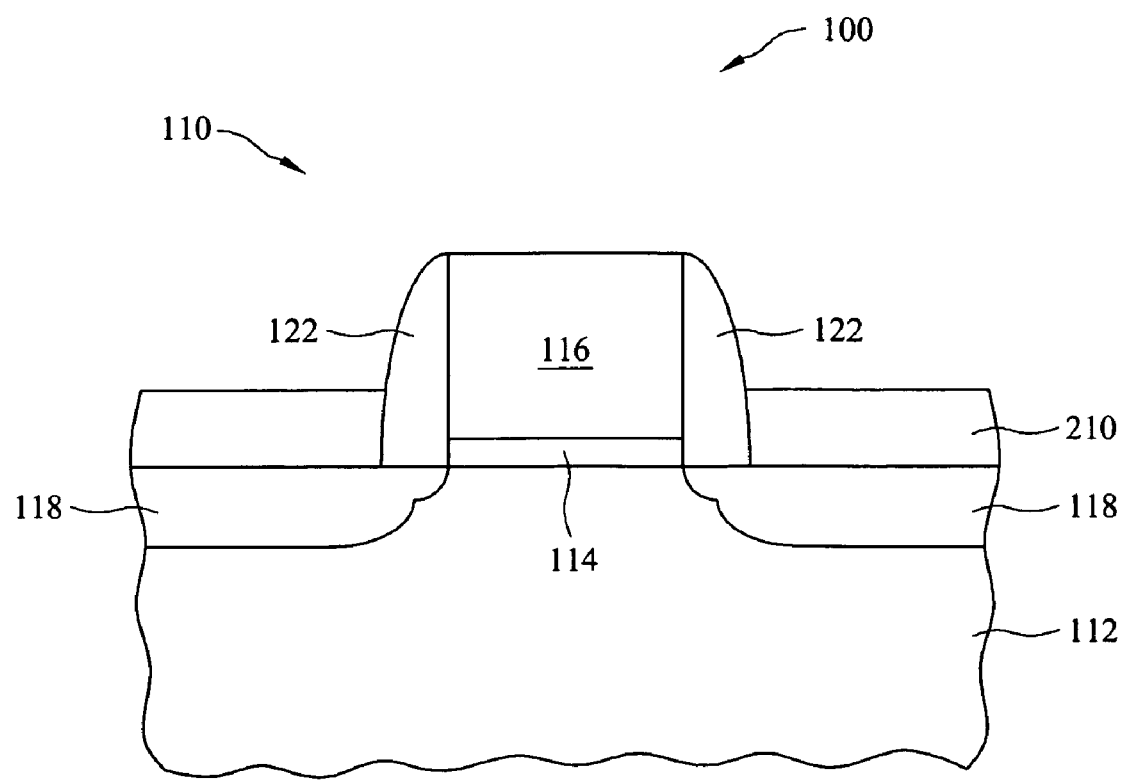

FIGS. 1-3 illustrate a method embodiment for fabricating a semiconductor device having a strained channel region in accordance with an embodiment of the present invention. Embodiments of the present invention illustrated herein may be used in a variety of circuits. Referring first to FIG. 1, a wafer 100 is shown comprising a transistor 110 formed on a substrate 112. The substrate 112 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

A gate dielectric layer 114 and a gate electrode 116 are formed and patterned as is known in the art on the substrate 112. The gate dielectric 114 is preferably a high-K dielectric material, such as silicon oxide, silicon oxynitride, silicon nitride, an oxide, a nitrogen-containing oxide, a combination thereof, or the like. Preferably, the gate dielectric 114 has a relative permittivity value greater than about 4. Other examples of such materials include aluminum oxide, lanthanum oxide, hafnium oxide, zirconium oxide, hafnium oxynitride, or combinations thereof.

In the preferred embodiment in which the gate dielectric layer 114 comprises an oxide layer, the gate dielectric layer 114 may be formed by any oxidation process, such as wet or dry thermal oxidation in an ambient comprising an oxide, $H_2O$, NO, or a combination thereof, or by chemical vapor deposition (CVD) techniques using is tetra-ethyl-ortho-silicate (TEOS) and oxygen as a precursor. In the preferred embodiment, the gate dielectric layer 114 is about 8 Å to about 50 Å in thickness, but more preferably about 16 Å in thickness.

The gate electrode 116 preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In the preferred embodiment in which the gate electrode is poly-silicon, the gate electrode 116 may be formed by depositing doped or undoped poly-silicon by low-pressure chemical vapor deposition (LPCVD) to a thickness in the range of about 400 Å to about 2500 Å, but more preferably about 1500 Å.

The gate dielectric 114 and the gate electrode 116 may be patterned by photolithography techniques as is known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate dielectric 114 and the gate electrode 116 as illustrated in FIG. 1. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

Source/drain regions 118 may be formed by ion implantation. The source/drain regions 118 may be implanted with an n-type dopant, such as phosphorous, nitrogen, arsenic, antimony, or the like, to fabricate NMOS devices or may be implanted with a p-type dopant, such as boron, aluminum, indium, and the like, to fabricate PMOS devices. Optionally, NMOS devices may be fabricated on the same chip as PMOS devices. In this optional embodiment, it may be necessary to utilize multiple masking and ion implant steps as is known in the art such that only specific areas are implanted with n-type and/or p-type ions.

Spacers 122, which form spacers for a second ion implant in the source/drain regions 118, preferably comprise silicon nitride ($Si_3N_4$), or a nitrogen containing layer other than $Si_3N_4$, such as $Si_xN_y$, silicon oxynitride $SiO_xN_y$, silicon oxime $SiO_xN_y:H_z$, or a combination thereof. In a preferred embodiment, the spacers 122 are formed from a layer comprising $Si_3N_4$ that has been formed using chemical vapor deposition (CVD) techniques using silane and ammonia as precursor gases.

The spacers 122 may be patterned by performing an isotropic or anisotropic etch process, such as an isotropic etch process using a solution of phosphoric acid ($H_3PO_4$). Because the thickness of the layer of $Si_3N_4$ is greater in the regions adjacent to the gate electrode 116, the isotropic etch removes the $Si_3N_4$ material on top of the gate electrode 116 and the areas of substrate 112 not immediately adjacent to the gate electrode 116, leaving the spacer 122 as illustrated in FIG. 1.

It should be noted that a silicidation process may be performed. The silicidation process may be used to improve the conductivity of conductive gate electrode 116, as well as to decrease source/drain regions 118 resistance. The silicide may be formed by depositing a metal layer such as titanium, nickel, tungsten, or cobalt via plasma vapor deposition (PVD) procedures. An anneal procedure causes the metal layer to react with conductive gate electrode 116 and the source/drain regions 118 to form metal silicide. Portions of the metal layer overlying insulator spacers 122 remain unreacted. Selective removal of the unreacted portions of the metal layer may be accomplished, for example, via wet etch procedures. An additional anneal cycle may be used if desired to alter the phase of silicide regions, which may result in a lower resistance.

It should also be noted that the above description is but one example of a transistor 110 that may be used with an embodiment of the present invention. Other transistors and other semiconductor devices may also be used. For example, the transistor may have raised source/drains, the transistor may be a split-gate transistor or a FinFET design, different materials and thicknesses may be used, liners may be used between the spacer and the gate electrode, or the like, may be used.

FIG. 2 illustrates wafer 100 after a high-stress film 210 has been formed thereon, covering the transistor 110 in accordance with an embodiment of the present invention. It should be noted that the high-stress film 210 may be either a tensile-stress film or a compressive-stress film. A tensile-stress film results in tensile strain in the channel region and enhances electron mobility of an n-channel transistor, and a compressive-stress film results in compressive strain in the channel region and enhances hole mobility of a p-channel transistor. The high-stress film may also cover other structures (not shown), such as shallow-trench isolations (STIs).

The high-stress film 210 may be formed, for example, by a chemical vapor deposition (CVD) process, a physical vapor deposition process (PVD), an atomic layer deposition process (ALD), or the like. Preferably, a tensile-stress film has a thickness from about 5 nm to about 500 nm and exerts a tensile stress in the range of about 0 GPa to about 5 GPa substantially along the source-to-drain direction. A compressive-stress film preferably has a thickness from about 5 nm to about 500 nm and exerts a compressive stress in the range of about 0 GPa to about −5 GPa. Materials that may be suitable for use as a tensile-stress film include SiN, oxide, oxynitride, SiC, SiCN, Ni silicide, Co silicide, combinations thereof, and the like. Materials that may be suitable for use as a compressive-stress film include SiGe, SiGeN, nitride, oxide, oxynitride, combinations thereof, and the like.

FIG. 3 illustrates wafer 100 after the high-stress film 210 has been substantially removed from the top of the gate electrode 116 in accordance with an embodiment of the present invention. It has been found that the high-stress film 210 over the gate electrode 116 may adversely affect the tensile/compressive stress in the channel region. In particular, it has been found that a high-stress film 210 over the gate electrode 116 may result in a downward stress rather than a tensile/compressive strain along the source-to-drain direction. Accordingly, in accordance with an embodiment of the present invention, the high-stress film 210 is preferably substantially removed from over the gate electrode 116.

The high-stress film 210 may be removed by photolithography techniques known in the art. In the present case, the photoresist material may be deposited, patterned, and developed such that the high-stress film 210 is exposed over the gate electrode 116. Thereafter, the exposed portions of the high-stress film 210 may be etched to remove the high-stress film 210 over the gate electrode 116.

It should be noted that although the high-stress film 210 is illustrated as having a planar surface, the surface of the high-stress film 210 may have a non-planar surface. The thickness of the high-stress film 210 is greater along the sides of the gate electrode 116 than on the top of the gate electrode 116. As a result, after etching, the high-stress film 210 may be raised or thicker along the sides of the gate electrode 116. In another embodiment in which an etching method that exhibits a high-etch selectivity between the high-stress film 210 and the gate electrode 116 is used, the etching process may be performed for a longer period of time, resulting in a valley or a thinner portion of the high-stress film 210 along the sides of the gate electrode 116.

If tensile SiN, for example, is used to as a tensile-stress film, the tensile-stress film may be etched using a dry etch process. If compressive SiN, for example, is used to as a compressive-stress film, the compressive-stress film may be etched using a dry etch process.

Figure 3A:
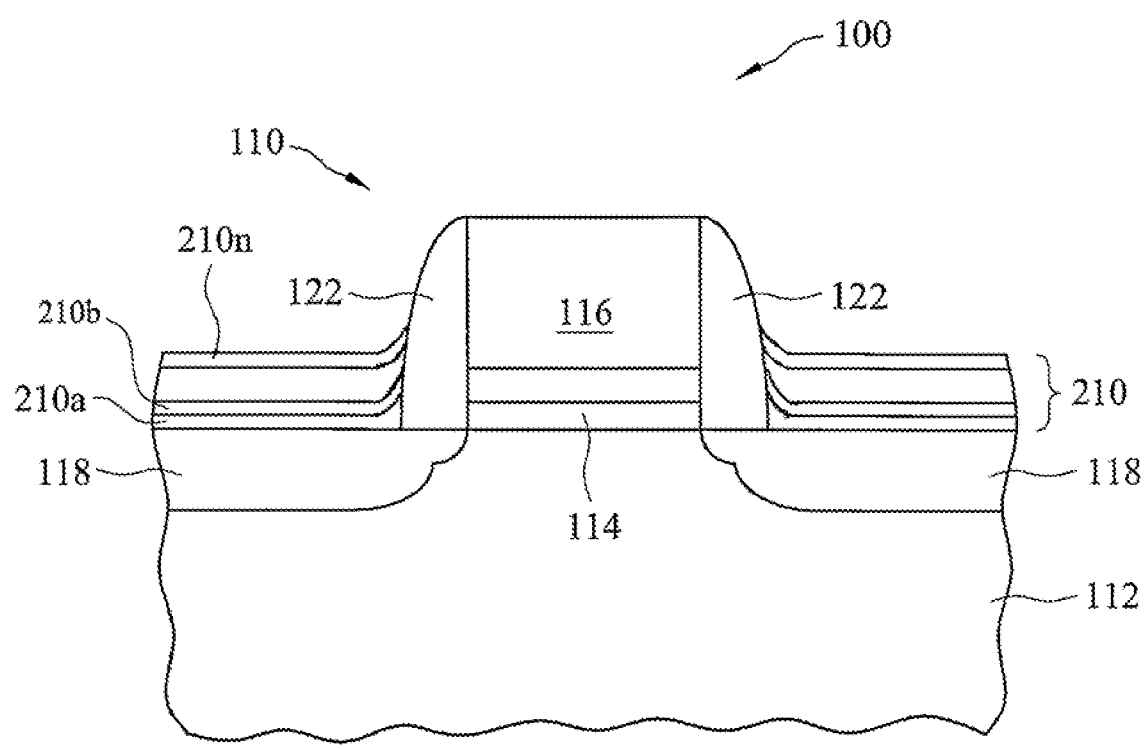
FIG. 3a illustrates an embodiment of the present invention utilizing a multi-layer stress film.

It should be noted that the high-stress film 210 may comprise a plurality of layers of either the same or different materials having the same or different stress characteristics. FIG. 3a illustrates an embodiment of the invention in which the high-stress film 210 comprises layers 210a, 210b, . . . 210n. Furthermore, it should be noted that embodiments of the present invention may be used to fabricate wafers having both NMOS and PMOS devices thereon. For example, high-stress films may be formed and patterned individually by known deposition and patterning techniques to create NMOS transistors having a tensile-stress film and PMOS transistors having a compressive-stress film on the same wafer. This allows each transistor to be independently customized for its particular function.

Thereafter, standard processes may be used to complete fabrication and packaging of the semiconductor device. For example, an optional contact-etch stop layer may be formed, inter-layer dielectrics and metal layers may be formed and patterned, other circuitry may be formed, the wafer may be diced and packaged, and the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device on a semiconductor substrate, the method comprising:
   providing a transistor on the semiconductor substrate, the transistor having a source/drain region, a gate electrode, and spacers formed alongside the gate electrode;
   forming a high-stress film over the transistor; and
   removing the high-stress film over the gate electrode and at least a portion of the spacers;
   wherein the transistor comprises an n-channel transistor and the high-stress film results in tensile stress in a channel region and enhances electron mobility.

2. The method of claim 1, wherein the high-stress film comprises SiN, oxynitride, oxide, SiC, SiCN, Co silicide, Ni silicide, or combinations thereof.

3. The method of claim 1, wherein the high-stress film comprises a plurality of films.

4. The method of claim 1, further comprising forming a contact etch-stop layer over the transistor and the high-stress film.

5. The method of claim 1, wherein the high-stress film has a thickness between about 5 nm and about 500 nm.

6. A method of forming a semiconductor device on a semiconductor substrate, the method comprising:
   providing a transistor on the semiconductor substrate, the transistor having a source/drain region, a gate electrode, and spacers formed alongside the gate electrode;
   forming a high-stress film over the transistor; and
   removing the high-stress film over the gate electrode and at least a portion of the spacers;
   wherein the transistor comprises a p-channel transistor and the high-stress film results in compressive stress in a channel region and enhances hole mobility.

7. The method of claim 6, wherein the high-stress film comprises SiN, oxynitride, oxide, SiGe, or combinations thereof.

8. The method of claim 6, wherein the high-stress film comprises a plurality of films.

9. The method of claim 6, further comprising forming a contact etch-stop layer over the transistor and the high-stress film.

10. The method of claim 6, wherein the high-stress film has a thickness between about 5 nm and about 500 nm.

11. A method of forming a semiconductor device, the method comprising:
    providing a substrate;
    forming an electrode on the substrate, the electrode being formed over a channel region and having spacers formed along opposing sides of the electrode;
    forming one or more high-stress layers over the substrate and the electrode; and
    removing the one or more high-stress layers over the channel region, thereby exposing at least a portion of the spacers;

wherein the electrode is a gate electrode of an n-channel transistor and the high-stress layers result in tensile stress in the channel region and enhance electron mobility.

12. The method of claim 11, wherein the high-stress layers comprise SiN, oxynitride, oxide, SiC, SiCN, Co silicide, Ni silicide, or combinations thereof.

13. The method of claim 11, wherein the high-stress layers comprise a plurality of films.

14. The method of claim 11, further comprising forming a contact etch-stop layer over the electrode and the high-stress layers.

15. A method of forming a semiconductor device, the method comprising:
   providing a substrate;
   forming an electrode on the substrate, the electrode being formed over a channel region and having spacers formed along opposing sides of the electrode;
   forming one or more high-stress layers over the substrate and the electrode; and
   removing the one or more high-stress layers over the channel region, thereby exposing at least a portion of the spacers;
   wherein the electrode is a gate electrode of a p-channel transistor and the high-stress layers result in compressive stress in the channel region and enhance hole mobility.

16. The method of claim 15, wherein the high-stress layers comprise SiN, oxynitride, oxide, SiGe, or combinations thereof.

17. The method of claim 15, wherein the high-stress layers comprise a plurality of films.

18. The method of claim 15, further comprising forming a contact etch-stop layer over the electrode and the high-stress layers.

19. A method of forming a semiconductor device, the method comprising:
   providing a substrate having an electrical device formed thereon, the electrical device having an electrode over a channel region;
   forming a high-stress layer over the substrate and the electrode; and
   etching the high-stress layer over the channel region, the etching exposing the electrode;
   wherein the electrical device comprises an n-channel transistor and the high-stress layer results in tensile stress in the channel region and enhances hole mobility.

20. The method of claim 19, wherein the high-stress layer comprises a plurality of films.

21. The method of claim 19, further comprising forming a contact etch-stop layer over the electrical device and the high-stress layer.

22. A method of forming a semiconductor device, the method comprising:
   providing a substrate having an electrical device formed thereon, the electrical device having an electrode over a channel region;
   forming a high-stress layer over the substrate and the electrode; and
   etching the high-stress layer over the channel region, the etching exposing the electrode;
   wherein the electrical device comprises a p-channel transistor and the high-stress layer results in compressive stress in the channel region and enhances hole mobility.

23. The method of claim 22, wherein the high-stress layer comprises a plurality of films.

24. The method of claim 22, further comprising forming a contact etch-stop layer over the electrical device and the high-stress layer.

* * * * *